US012681054B2

(12) United States Patent (10) Patent No.: US 12,681,054 B2
Pettersson (45) Date of Patent: Jul. 14, 2026

(54) FAULT DETECTION FOR A FLYING CAPACITOR CONVERTER

(71) Applicant: ABB Schweiz AG, Baden (CH)

(72) Inventor: Sami Pettersson, Dietikon (CH)

(73) Assignee: ABB Schweiz AG, Baden (CH)

( * ) Notice: Subject to any disclaimer, the term of this patent is extended or adjusted under 35 U.S.C. 154(b) by 313 days.

(21) Appl. No.: 18/495,262

(22) Filed: Oct. 26, 2023

(65) Prior Publication Data

US 2024/0142501 A1 May 2, 2024

(30) Foreign Application Priority Data

Oct. 26, 2022 (EP) ..................................... 22203889

(51) Int. Cl.
*G01R 19/165* (2006.01)
*G01R 31/40* (2020.01)
*H02H 7/12* (2006.01)

(52) U.S. Cl.
CPC ....... *G01R 19/16571* (2013.01); *G01R 31/40* (2013.01); *H02H 7/1213* (2013.01)

(58) Field of Classification Search
CPC ............. G01R 19/16571; G01R 31/40; H02M 1/0009; H02M 1/327; H02M 3/155; H02H 7/1213
USPC ............................................. 323/282; 363/56
See application file for complete search history.

(56) References Cited

U.S. PATENT DOCUMENTS

| | | | | |
|---|---|---|---|---|
| 2019/0386481 A1* | 12/2019 | Cho | ................. | G01R 19/16571 |
| 2020/0292629 A1* | 9/2020 | He | ......................... | H02M 7/537 |
| 2021/0336529 A1* | 10/2021 | Zhou | ...................... | H02H 3/087 |
| 2021/0336530 A1* | 10/2021 | Shen | ........................ | H02M 1/32 |
| 2022/0247306 A1 | 8/2022 | Zhang et al. | | |
| 2024/0280645 A1* | 8/2024 | Khamesra | ......... | H02M 3/33515 |
| 2024/0364211 A1* | 10/2024 | Bishnoi | ................. | H02M 7/487 |

FOREIGN PATENT DOCUMENTS

EP          2747260 B1     8/2019

OTHER PUBLICATIONS

Jones et al., "Construction and Testing of a 13.8 kV, 750 kVA 3-Phase Current Compensator Using Modular Switching Positions," *2021 IEEE Applied Power Electronics Conference and Exposition (APEC)*, 2050-2057 (Jun. 14-17, 2021).

(Continued)

*Primary Examiner* — Yemane Mehari
(74) *Attorney, Agent, or Firm* — Fitch Even Tabin & Flannery LLP

(57) ABSTRACT

A flying capacitor converter comprises a converter input comprising a positive pole and a negative pole, an output terminal, and a plurality of cells, each cell comprising two switches and a flying capacitor arranged between each cell. A method for detecting a plurality of faults in the converter includes measuring, by a second current sensor arranged at the positive pole, a second current; measuring by a third current sensor arranged at the negative pole, a third current; and detecting a first fault in the flying capacitor converter when the second current or the third current exceeds a first current threshold, and/or when a gradient of the second current or a gradient of the third current exceeds a first gradient threshold.

14 Claims, 6 Drawing Sheets

(56) References Cited

OTHER PUBLICATIONS

Pallo et al., "Short-Circuit Fault Ride-Through of Flying-Capacitor Multilevel Converters through Rapid Fault Detection and Idle-Mode Operation," *2020 IEEE 21st Workshop on Control and Modeling for Power Electronics (COMPEL)*, 8 pp. (Nov. 9-12, 2020).

Rodriguez et al., "Multilevel Converters: An Enabling Technology for High-Power Applications," *Proceedings of the IEEE*, 97(11): 1786-1817 (Nov. 2009).

Turpin et al., "Fault Management of Multicell Converters," *IEEE Transactions on Industrial Electronics*, 49(5): 988-997 (Oct. 2002).

European Patent Office, Extended European Search Report in European Patent Application No. 22203889.5, 10 pp. (Mar. 23, 2023).

\* cited by examiner

$$i_{cdc1} = I_{dc} - i_{dc+} \qquad i_{cdc2} = i_{cdc1} + i_n = I_{dc} - i_{dc+} + i_n$$

$$i_{dc-} = i_{cdc2} - I_{dc} = I_{dc} - i_{dc+} + i_n - I_{dc} = i_n - i_{dc+}$$

FAULT DETECTION FOR A FLYING CAPACITOR CONVERTER

CROSS-REFERENCE TO RELATED APPLICATIONS

The instant application claims priority to European Patent Application No. 22203889.5, filed Oct. 26, 2022, which is incorporated herein in its entirety by reference.

FIELD OF THE DISCLOSURE

The present disclosure relates to flying capacitor converters for high voltages and, more specifically, to a system and method for detecting a plurality of faults in the converter.

BACKGROUND OF THE INVENTION

Flying capacitor converters (FCCs) are used for a broad range of voltages. But converter switches for high voltages may be quite expensive. Hence, a way to substitute the high-voltage converter switches by converter switches would be desirable. However, for a real-world operation, also a short circuit detection for this converter needs to be implemented.

BRIEF SUMMARY OF THE INVENTION

In a general aspect, the present disclosure describes a flying capacitor converter with a fault detection apparatus.

One aspect relates to a method for detecting a plurality of faults in a flying capacitor converter, the flying capacitor converter comprising: a converter input comprising a positive pole and a negative pole, the positive pole connected to a positive leg of the converter and the negative pole connected to a negative leg of the converter, an output terminal, connected to an output of the positive leg and to an output of the negative leg, the positive leg comprising a plurality of positive switches, the negative leg comprising a plurality of negative switches, wherein an input of each one of the positive switches is connected to a corresponding input of each one of the negative switches via a flying capacitor.

The method comprises the steps of: Measuring, by a second current sensor arranged at the positive pole, a second current; measuring, by a third current sensor arranged at the negative pole, a third current; and detecting a first fault in the flying capacitor DC/AC converter, if the second current or if the third current exceeds a first current threshold, and/or if a gradient of the second current or a gradient of the third current exceeds a first gradient threshold.

The flying capacitor converter may be designed, for instance, as a DC/AC converter. However, the flying capacitor converter may also—i.e. with minor or no changes—be designed as a DC/DC converter and/or as a bidirectional converter. The flying capacitor converter may also be described by comprising a plurality of "cells" in a serial arrangement, each cell comprising a switch, which is part of the positive leg (or upper leg, or upper DC rail), and a switch, which is part of the negative leg (or lower leg, or lower DC rail), of the converter. Between each one of the "cells", a "flying capacitor" is arranged. The number of cells may depend on the overall voltage of the flying capacitor converter and on the allowed voltage (or nominal voltage) of the switches of the "cells". For example, if the overall voltage of the flying capacitor converter is 1200 V and the allowed voltage of each switch of the "cells" is 150 V, then 1200/150=8 "cells" and, thus, 16 switches are required. In many cases, these 16 low-voltage converter switches are cheaper than one high-voltage switch.

The "cells" may be arranged between the converter input and the converter output, more concretely: between the poles (i.e. positive pole and a negative pole) of the converter input and the converter output terminal. Thus, one leg (the positive leg) of the converter stretches from the positive pole to the output terminal and one leg (the negative leg) of the converter stretches from the negative pole to the output terminal. For the above example, each leg comprises 8 switches in a serial arrangement. Each one of the switches may have essentially the same allowed voltage. All switches may be of the same type, e.g. they may be MOSFET transistors (MOSFET: metal-oxide-semiconductor field-effect transistors) or IGBTs (Insulated Gate Bipolar Transistors).

The measurements of the method may be based on a second current sensor, on a third current sensor, and/or (additionally or as an alternative) on a first current sensor. The first current sensor may be arranged at the output terminal, for measuring a first current. The second current sensor may be arranged at the positive pole, for measuring a second current. The third current sensor may be arranged at the negative pole, for measuring a third current. If a gradient of the second current or if a gradient of the third current exceeds a first threshold, then a first fault in the flying capacitor converter is detected. The first fault may be caused by a short of the switch that is arranged next to the positive pole of the negative pole, respectively. Both the current amplitude and the gradient of the second or the third current are very steep. Hence, they may serve well—and even unambiguously—as an indicator for the first fault. In some embodiments, determining only the first current amplitude or only the first gradient of the second or the third current may be sufficient. In various embodiments, the first current threshold may be about 200% or 300% (or higher) of the converter's maximum current, and/or the first gradient may exceed a first threshold, i.e. a current gradient of 1 A/μs, 10 A/μs, or 100 A/μs. An example showing exemplary currents and gradients of the first fault is depicted in FIG. 4.

Hence, the method and/or the flying capacitor converter brings numerous benefits. One benefit is that, by dividing the flying capacitor converter into a plurality of cells, the energy stored in each of the flying capacitors is much lower than for a flying capacitor of a converter with one single cell. Consequently, the energy stored in the flying capacitors is not large enough to destroy the switches, e.g. the MOSFETs, even if the cell is shorted. This may be particularly true for low-voltage MOSFETs, which may be very robust. Another benefit is that, for detecting the first fault (and for further types of faults, as described below) in a plurality of cells, current sensors are not required for each cell of the converter, but only two (or, in some embodiments, three) current sensors for the complete converter are necessary.

BRIEF DESCRIPTION OF THE SEVERAL VIEWS OF THE DRAWING(S)

FIG. 10*a* is a printed circuit board (PCB) schematic of a flying capacitor converter according to an embodiment of the present disclosure.

FIG. 10*b* is an enlarged detail section view of a portion of a PCB with a flying capacitor converter according to an embodiment of the present disclosure.

Figure 11:
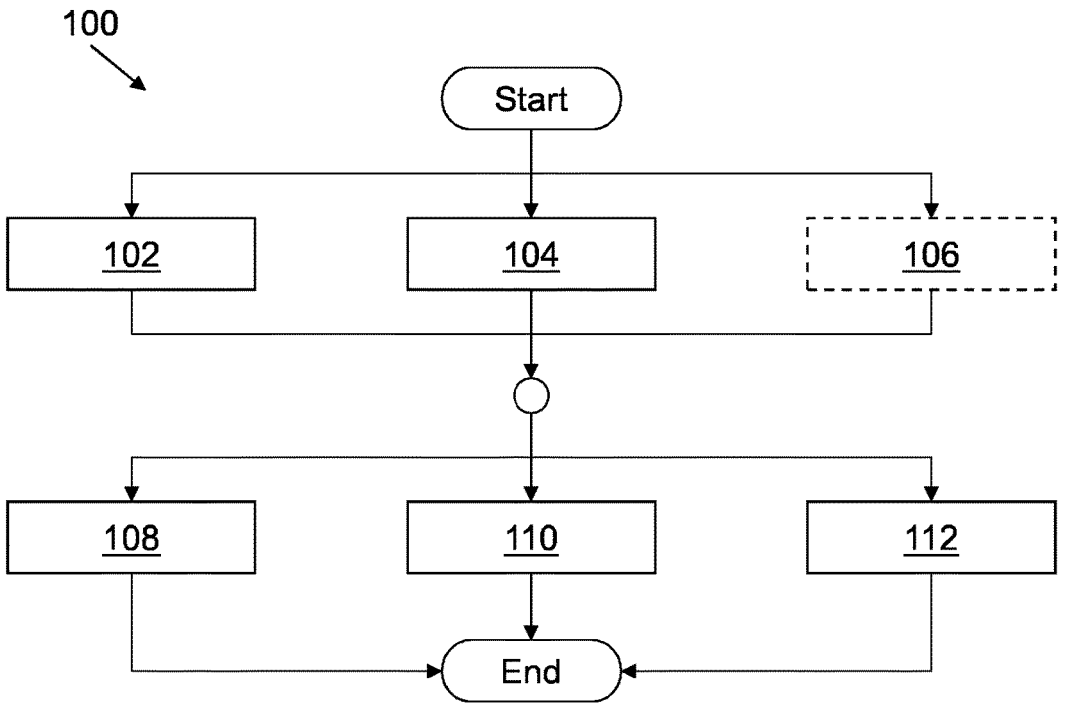

FIG. 11 is a flowchart for a method in accordance with the present disclosure.

Figure 12:
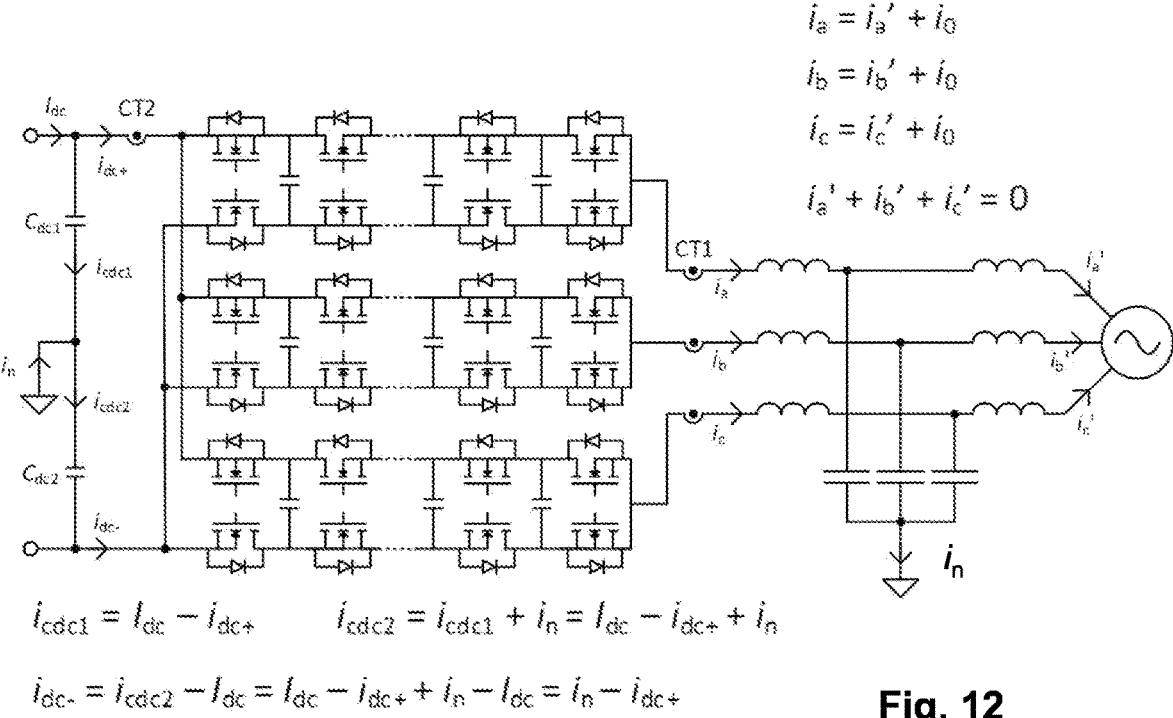

FIG. 12 is a circuit schematic with annotations showing a fault detection apparatus according to an embodiment of the present disclosure.

DETAILED DESCRIPTION OF THE INVENTION

Figure 1A:
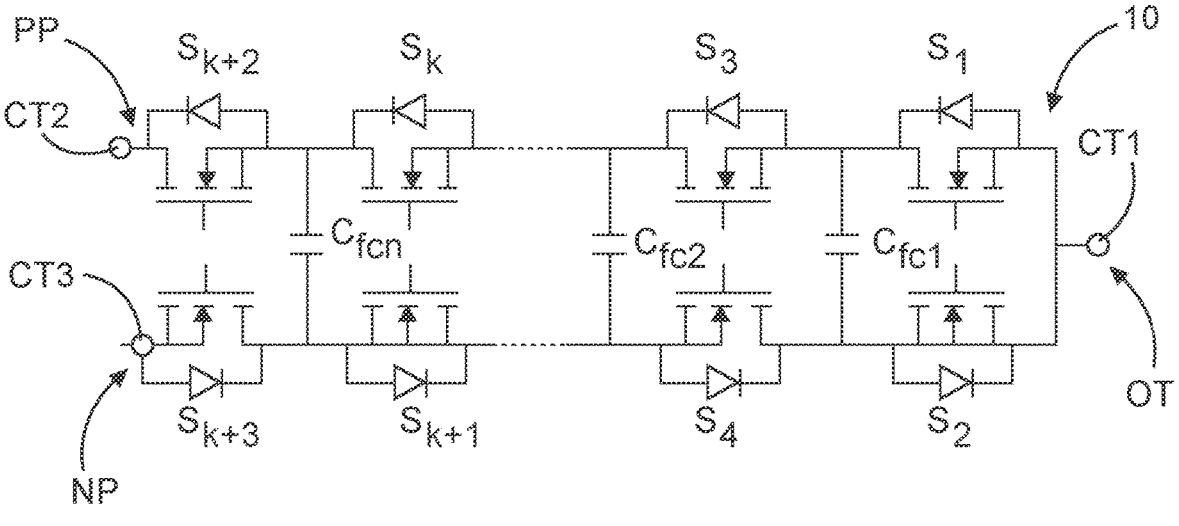
FIG. 1a is a circuit schematic of a flying capacitor converter according to an embodiment of the present disclosure.

FIG. 1*a* shows schematically a flying capacitor converter 10 according to an embodiment. The flying capacitor converter 10 comprises a converter input comprising a positive pole PP and a negative pole NP. The positive pole PP is connected to a positive leg PL of the converter, and the negative pole NP is connected to a negative leg NL of the converter 10. The converter 10 further comprises an output terminal OT, which is connected to an output of the positive leg PL and to an output of the negative leg NL. The positive leg PL comprises a plurality of positive switches $S_1$, $S_3$, $S_k$, $S_{k+2}$. The negative leg NL comprising a plurality of negative switches $S_2$, $S_4$, $S_{k+1}$, $S_{k+3}$. An input of each one of the positive switches $S_1$, $S_3$, $S_k$, $S_{k+2}$ is connected to a corresponding input of each one of the negative switches $S_2$, $S_4$, $S_{k+1}$, $S_{k+3}$ via a flying capacitor $C_{fc1}$, $C_{fc2}$. A control input of each one of the switches $S_1$-$S_{k+3}$ may be connected to a converter control unit (not shown), which controls all phases of this flying capacitor converter 10. The sub-circuits of the flying capacitor converter 10 may also be called "cells", wherein each cell comprises a pair of a positive switch and a negative switch, e.g., $S_{k+1}$ and $S_{k+3}$, $S_1$ and $S_2$, etc. A first current sensor CT1 may be arranged at the output terminal OT, thus measuring a current cu1 (see FIG. 1*b*) through the output terminal OT. A second current sensor CT2 may be arranged at the positive pole PP, thus measuring a current cu2 through the positive pole PP. A third current sensor CT3 may be arranged at the negative pole NP, thus measuring a current cu3 through the negative pole NP.

Figure 1B:
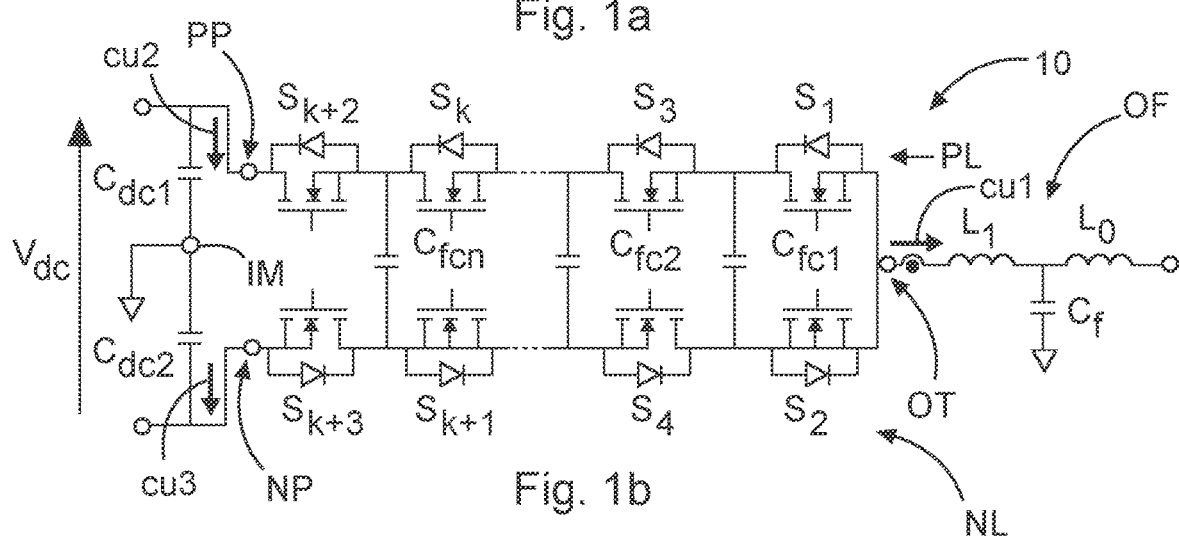
FIG. 1b is a circuit schematic of a flying capacitor converter according to another embodiment of the present disclosure.

FIG. 1*b* shows schematically a flying capacitor converter 10 according to another embodiment. The converter 10 of FIG. 1*b* comprises the components of the converter of FIG.

1*a* plus an input capacitor $C_{dc1}$, $C_{dc2}$, which is arranged in parallel to the positive pole PP and the negative pole NP. Between $C_{dc1}$ and $C_{dc2}$, an input midpoint IM is defined. Furthermore, an output filter OF that comprises an LCL filter and is arranged after the output terminal OT. The input capacitor may be, additionally or as an alternative, a single input capacitor. An input DC voltage $V_{dc}$ is arranged in parallel to the positive pole PP and the negative pole NP. Note that for a clear depiction of the faults, in the following figures some of the reference signs (e.g. "PL") are left out.

Figure 2:
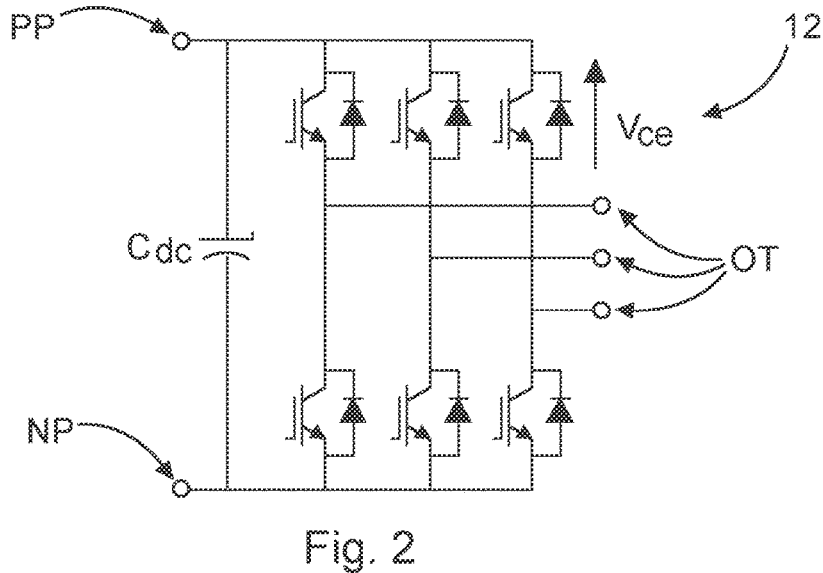
FIG. 2 is a circuit schematic of a three-phase converter topology in accordance with the disclosure.

FIG. 2 shows schematically a topology of a three-phase converter 12. The converter 12 comprises six high-voltage IGBT switches. In at least some converters 12, each IGBT may have its own short circuit detection and/or protection, which may be based, e.g., on desaturation detection. This may be achieved by monitoring each IGBT's collector-emitter voltage $V_{ce}$. If the voltage $V_{ce}$ drops below a certain threshold (when the IGBT is turned on), a short circuit protection may be triggered. Using a plurality of low-voltage IGBT switches instead of each one of the IGBTs may lead to a quite high effort. The method and apparatus described above and/or below discloses an alternative.

Figures 3, 4:
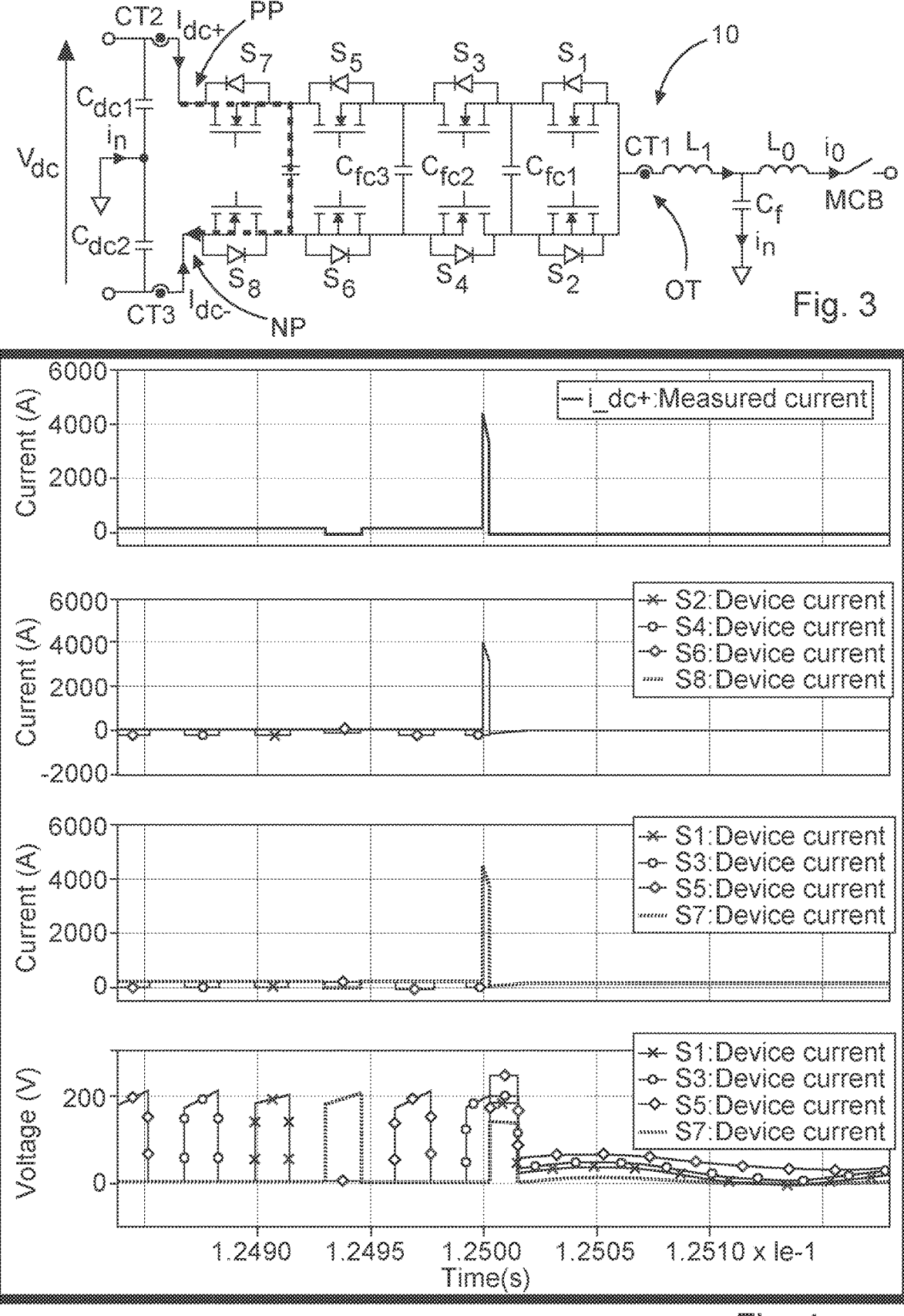
FIG. 3 is a circuit schematic of a flying capacitor converter having a fault according to an embodiment of the present disclosure.
FIG. 4 is a plurality of current and voltage diagrams of a flying capacitor converter having a fault according to FIG. 3.

FIG. 3 shows schematically a flying capacitor converter 10 having a fault according to an embodiment. The fault is characterized by a short of switch S 7 and/or S 8 (the switches next to the input poles), thus shorting the poles PP and NP in at least one converting phase of the flying capacitor converter 10. This kind of fault may require a very fast reaction time, in order to prevent a damage of converter components. For detecting this fault, which may be similar or equal to the first fault, a measurement at CT2 and/or CT3 may be taken.

FIG. 4 shows a plurality of current and voltage diagrams of a flying capacitor converter 10 having a fault according to FIG. 3. The topmost diagram depicts a second current cu2 (or "i_dc+" in FIG. 4) measured by CT2 at the positive pole PP, when switches $S_7$ and $S_8$ are shortened, i.e. when a fault similar or equal to the first fault occurs. This fault may occur either when $S_7$ and $S_8$ are shortened, or when one of them is shortened and the other switch is switched on, e.g. in a phase of the flying capacitor converter 10. The second diagram depicts a current through the switches $S_2$-$S_8$ of the negative leg NL of the converter 10, and the third diagram depicts a current through the switches $S_1$-$S_7$ of the positive leg PL of the converter 10. The bottom diagram depicts a voltage parallel to the switches $S_1$-$S_7$ of the positive leg PL of the converter 10. The very high gradient of the second current through CT2 is clearly visible in the topmost diagram. The gradient shown here is (possibly much) greater than 100 A/μs. To get this gradient—at least indirectly—the current measurement sampling rate needs to be high enough, for instance greater or equal 100,000 samples per second, 1,000,000 samples per second, or even greater. For changing a fault detection apparatus, which can detect this kind of fault, to a fault protection apparatus, the fault protection apparatus may be able to switch off the still-working switch of $S_7$ or $S_8$ (i.e. if $S_7$ is shortened, then turn off $S_8$). Switching off $S_7$ or $S_8$ may be done by a signal to both switches of this cell. Additionally or as an alternative, disconnecting the converter input may be done, e.g., by an additional emergency switch that is arranged before the converter input pole(s).

Figures 5, 6:
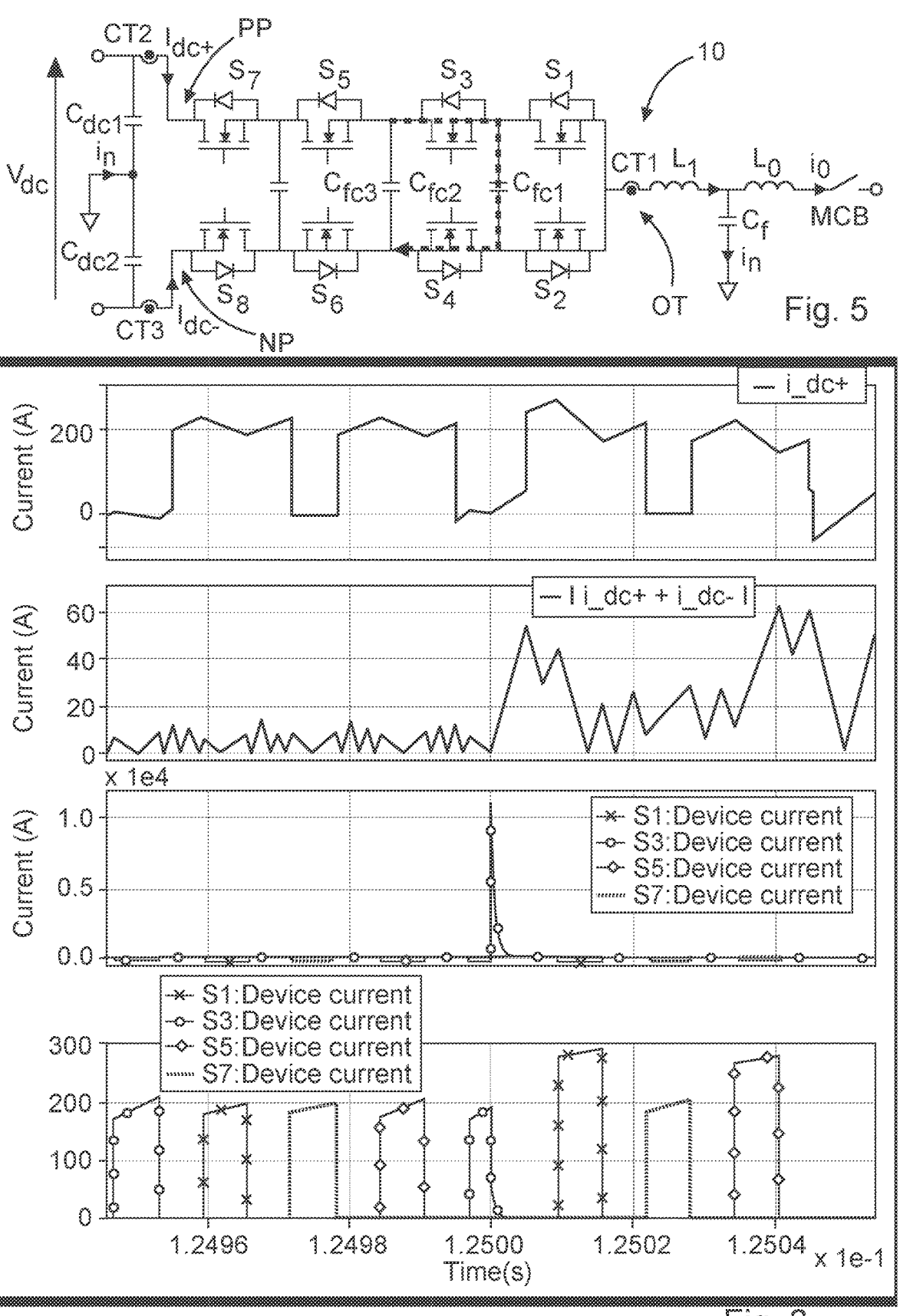
FIG. 5 is a circuit schematic of a flying capacitor converter having a fault according to an embodiment of the present disclosure.
FIG. 6 is a plurality of current and voltage diagrams of a flying capacitor converter having a fault according to FIG. 5.

FIG. 5 shows schematically a flying capacitor converter 10 having a fault according to an embodiment. The fault is characterized by a short of switch $S_3$ and/or $S_4$, i.e. of a switch that in in the mid of the converter steps, i.e. not next to the input poles (contrary to the fault shown in FIG. 3).

This fault may be similar or equal to the second fault. Since there is no switch-specific current sensing or voltage sensing, the large current spike of device $S_3$ (see FIG. 6) caused by the short cannot be detected directly. Also, for detecting this fault it is not sufficient to examine, by means of CT2, the current in the positive leg PL, but an absolute-value cu_sum of a sum of the second current cu2 plus the third current cu3 needs to be determined, i.e., cu_sum=abs (cu2+cu3)

When the cell voltages of the adjacent cells become equal due to the short, the voltage changes at the converter output terminal OT, which affects the neutral current flowing between the output terminal OT and an input midpoint IM (see FIG. 1b), and therefore also the currents in the legs PL and NL. Note that detecting this fault can only be performed if there is a connection between the output terminal OT and the input midpoint IM. It should, further, be noted that a pure level-based trigger may lead to incorrect detection results, because similar current transients may occur due to, e.g., load changes, grid voltage sags and swells, etc. Thus, in addition to a level-based trigger, monitoring the current rate of change (the current gradient) may advantageously provide more certainty on distinguishing true fault cases from other events.

FIG. 6 shows a plurality of current and voltage diagrams of a flying capacitor converter 10 having a fault according to FIG. 5. The top most diagram depicts a second current cu2 (or "i_dc+" in FIG. 6) measured by CT2 at the positive pole PP. The second diagram depicts an absolute-value cu_sum of a sum of the second current cu2 plus the third current cu3 (or "|i_dc++i_dc−|" in FIG. 6) measured by CT2 and CT3, respectively. The third diagram depicts a current through the switches $S_1$-$S_7$ of the positive leg PL of the converter 10. The bottom diagram depicts a voltage parallel to the switches $S_1$-$S_7$ of the positive leg PL of the converter 10.

The current spike through S 3 is clearly visible in the third diagram; however, this short cannot be detected directly, because there is no current sensor at $S_3$. However, it is clearly visible in the second diagram that cu_sum has a significantly higher gradient at this fault than at normal operation of the converter. The second threshold being lower than the first threshold. As a "cross-check" for this fault, the amount of cu_sum may be used.

Figures 7, 8:
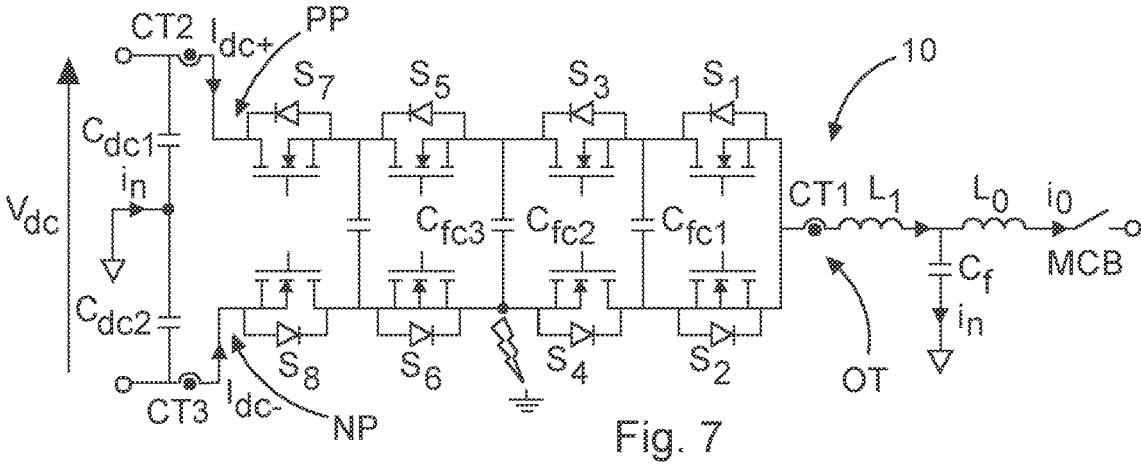
FIG. 7 is a circuit schematic of a flying capacitor converter having a fault according to an embodiment of the present disclosure.
FIG. 8 is a plurality of current and voltage diagrams of a flying capacitor converter having a fault according to FIG. 7.

FIG. 7 shows schematically a flying capacitor converter 10 having a fault according to an embodiment. The fault is characterized by a ground fault at the positive or negative leg of a middle cell. This fault may be similar or equal to the third fault. In the example case shown in FIG. 7, a ground fault takes place at the negative leg of a middle cell, between switches $S_6$ and $S_4$.

FIG. 8 shows a plurality of current and voltage diagrams of a flying capacitor converter 10 having a fault according to FIG. 7. The simulation results depicted in FIG. 8 show that an absolute-value cu_sum of a sum of the second current cu2 plus the third current cu3 (second diagram) can be used to base on this a detection of this fault. The second diagram clearly shows a steep gradient of cu_sum. As a "cross-check" for this fault, the (partly negative) gradient of cu2 (or "i_dc+" in FIG. 8) may be used.

Figure 9:
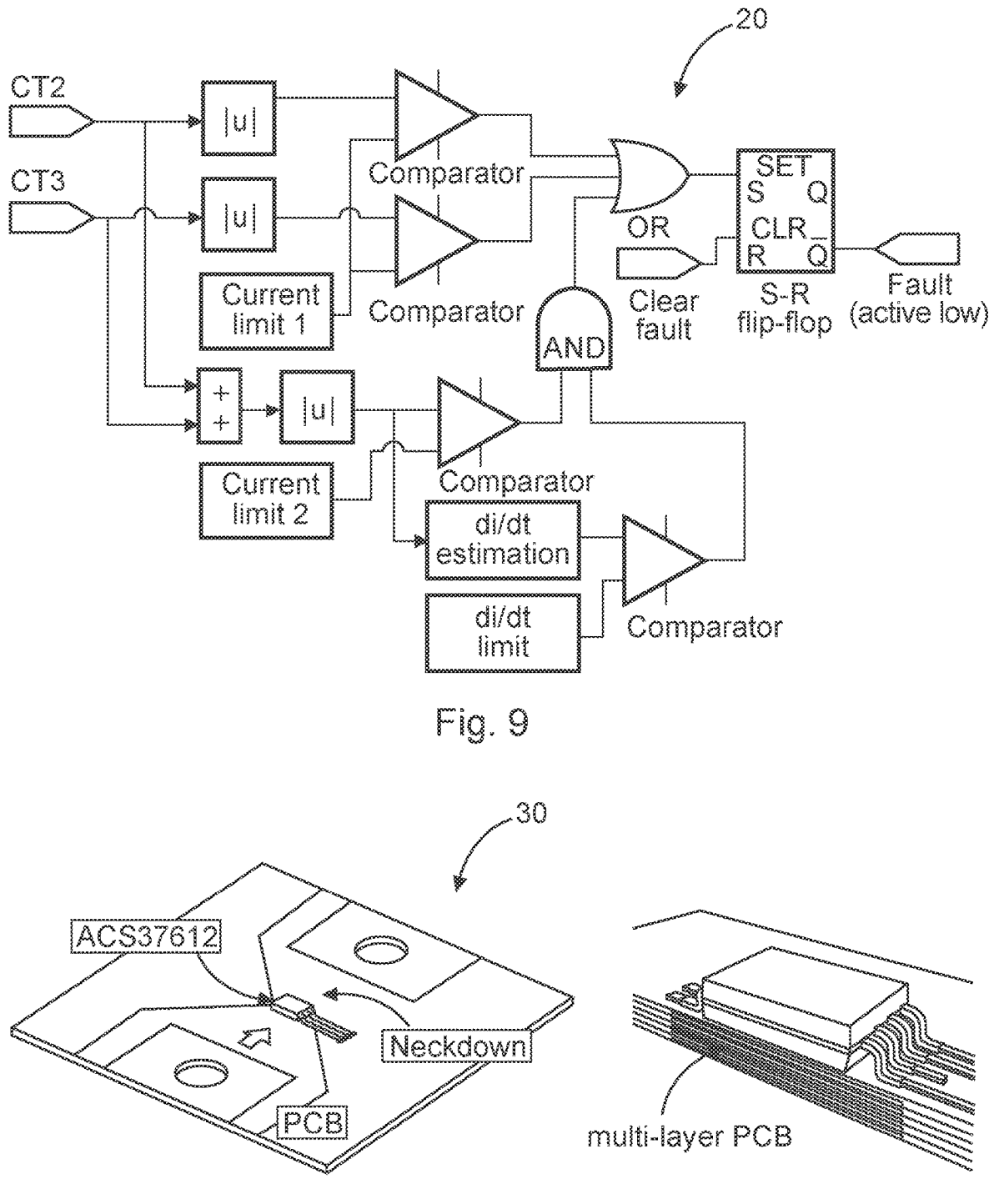
FIG. 9 is a logic flow diagram for a fault detection apparatus according to an embodiment of the present disclosure.

FIG. 9 shows schematically a fault detection apparatus 20 according to an embodiment. The fault detection apparatus 20 may be used for performing a method as described above and/or below. FIG. 9 shows three parallel signal paths: the positive rail current, the negative rail current, and the sum current. In each path, first the absolute value of the current is calculated, to remove the impact of current direction before any other action is applied. The first two paths, from CT2 and CT3 that input currents cu2 and cu3, respectively, for the currents of the positive leg cu2 and the negative leg cu3 are identical, and the detection is based on the current's amplitude. The trigger level is set by the parameter "Current limit 1" to which the absolute value of the instantaneous current is compared. If the current is higher than the limit, the output signal of the comparator is set high. In another embodiment (not shown here), the gradients of the currents may be used, additionally or as an alternative, for determining this kind of fault.

The third path is for the absolute value cu_sum of the sum current. The third path has two internal parallel paths, one for amplitude detection and the other for the gradient di/dt detection. The trigger level for the amplitude detection of cu_sum is set by the parameter "Current limit 2", and the limit for the rate of change (i.e. the gradient di/dt) by the parameter "di/dt limit". Both conditions must be met for a safe detection of this kind of fault (AND gate).

Finally, all three parallel paths are combined, by an OR gate, into one fault indicator signal. That is, the protection can be triggered by any of the parallel paths. An S-R flip-flop is used to generate an active-low output signal, and further to enable a simple external fault clear signal interface. When the fault indicator signal is pulled down, the pulse width modulation of the semiconductor switches may be stopped immediately, e.g. by turning off the switches next to the converter's input. In addition, particularly if the system is connected to an external voltage source, such as a power grid, a main circuit breaker (MCB) may also be opened to disconnect the system from that external source, in order to prevent the external source from feeding the fault. However, it may take even some tens of milliseconds depending on the type of the mechanical switch before the MCB opens. The fault detection apparatus 20 may be implemented, at least partly, by an FPGA (field-programmable gate array).

FIG. 10a shows schematically a PCB 30 with a flying capacitor converter according to an embodiment. This design is an approach for solving the problem of sensing high currents with high bandwidth. Particularly, for the devices described above and/or below currents need to be sensed that flow between the main dc bus (the DC input source) and the FCC stage. This problem may be cumbersome, particularly for measuring currents of printed circuit board (PCB) traces. For these designs, it may be very advantageous to avoid unnecessary additional inductance and/or resistance on the PCB, and/or to avoid an unnecessary increasing of the lengths of the PCB traces, thus to avoid impairing the converter performance. This problem may be solved, e.g., by using PCB integrated Rogowski coils. FIG. 10a depicts a PCB with an alternative solution that uses, as an example, an integrated circuit (IC) ACS37612 by Allegro. Said IC has a wide bandwidth of up to 240 kHz and a measurement precision of ±1% in a compact 4.4 mm×3.0 mm package. This IC can be used for measuring currents in the range of hundreds of amperes. Another benefit is that the IC is mountable over a PCB trace, which reduces space requirements and a need for major PCB layout modifications. This solution is depicted in FIG. 10b, which shows schematically a part of a multilayer-PCB, whose layers are designed for carrying currents, e.g. to a flying capacitor converter according to an embodiment. Said sensor IC can also be integrated into bus bar structures.

FIG. 11 shows a flow diagram according to an embodiment. In a step 102, a second current cu2 is measured, by a second current sensor CT2 arranged at the positive pole PP of a flying capacitor converter 10 (see, e.g., FIG. 1a). In a step 104, a third current cu3 is measured, by a third current sensor CT3 arranged at the output terminal OT. In an optional step 106, a first current cu1 is measured, by a second current sensor CT2 arranged at the positive pole PP. The steps 102, 104, and 106 may be performed essentially in parallel.

In a step 108, a first fault in the flying capacitor converter 10 is detected, if the second current cu2 or if the third current cu3 exceeds a first current threshold, and/or if a gradient of the second current cu2 or a gradient of the third current cu3 exceeds a first gradient threshold. In a step 110, a second fault is detected, if an absolute value cu_sum of a sum of the second current cu2 plus the third current cu3 exceeds a second current threshold, and a gradient of the absolute value cu_sum exceeds a second gradient threshold, the second gradient threshold being lower than the first threshold. In a step 112, a third fault is detected, if a gradient of the second current cu2 exceeds a third current threshold, the third current threshold being negative, and a gradient of an absolute value cu_sum of a sum of the second current cu2 plus the third current cu3 exceeds a third gradient threshold, the third gradient threshold being lower than the first threshold. The steps 108, 110, and 112 may be performed essentially in parallel.

The steps 102-112 may be performed continuously during operating the flying capacitor converter 10. The steps 102-112 may be repeated, for instance, about 100,000 times per second, 1,000,000 times per second, or even more often. The repetition frequency may depend on the frequency the flying capacitor converter 10 is run.

FIG. 12 depicts a further embodiment of a FCC topology, i.e. a three-wire configuration to detect converter internal short-circuit faults. In this topology, the third current sensor CT3 may be substituted by the first current sensor CT1. The FCC has three partial FCCs—as shown, e.g., in FIG. 1b—arranged in parallel; the reference signs are the ones of FIG. 1b. The outputs OF of the three partial FCCs may be arranged, e.g., as a star-point or Y-topology for three phases. In this embodiment, CT3 may be omitted as there are three CT1s in total (one in each phase) and the sum of the three measured phase currents (called $i_a$, $i_b$, and $i_c$, respectively) forms a current $i_n$ ("zero-sequence current") flowing between the star-point of the LCL filter capacitors $C_f$ and the dc link midpoint IM. This zero-sequence current can be used to calculate the negative dc rail current, without a need to sense the current cu3 by a sensor CT3:

$$cu3 = i_n - cu2$$

where $i_n = i_a + i_b + i_c$.

In a further embodiment (not shown), the third current sensor CT3 may be kept, e.g., as an additional current sensor.

In various embodiments, the method further comprises the step of: Detecting a second fault if an absolute value of a sum of the second current plus the third current exceeds a second current threshold, and a gradient of the absolute value exceeds a second gradient threshold, the second gradient threshold being lower than the first threshold. Written as formulae:

$$IF(cu\_sum/dt) > threshold\_2\ THEN\ 2nd\_fault\_detected$$

where:

$$cu\_sum = abs(cu2 + cu3)$$

with: cu2=second current, at the second current sensor; and cu3=third current, at the third current sensor.

The second fault may indicate a short in other cells than in the cell next to the input poles. In various embodiments, second current threshold may be about 200% or 300% of the converter's normal operation current, and/or the second current gradient threshold may be about 1 A/µs, 10 A/µs, or 100 A/µs. An example showing exemplary currents and gradients of the second fault is depicted in FIG. 6.

In various embodiments, the method further comprises the step of: Detecting a third fault if a gradient of the second current exceeds a third current threshold, the third current threshold being negative, and a gradient of an absolute value of a sum of the second current plus the third current exceeds a third gradient threshold, the third gradient threshold being lower than the first threshold. The third fault may indicate a ground fault in a middle cell. In various embodiments, the third current threshold may be about 200% or 300% of the converter's normal operation current, and/or the third gradient threshold may be about 1 A/µs, 10 A/µs, or 100 A/µs. An example showing exemplary currents and gradients of the third fault is depicted in FIG. 8.

In various embodiments, each one of the positive switches and each one of the negative switches is a MOSFET transistor. The MOSFET transistor may be of a PMOS, NMOS or CMOS type. The MOSFET transistor may be of a depletion or an enhancement type. Throughout the FCC, the same MOSFET type may be used.

In various embodiments, the method further comprises the step of: If detecting the first fault, disconnecting the converter input and/or switching off at least the positive switch connected to the positive pole or switching off at least the negative switch connected to the negative pole. The disconnecting the converter input may be done, e.g., by an additional emergency switch. Switching off the positive or the negative switch may be done by a signal to both switches of this cell. The switching off may be done by only switching off the switches next to the respective input pole. This step may be relevant to develop the fault detection apparatus to a fault protection apparatus.

In various embodiments, the method further comprises the step of: If detecting the second fault or the third fault, switching off at least the positive switch connected to the positive pole and/or switching off at least the negative switch connected to the negative pole. This step may also be relevant to develop the fault detection apparatus to a fault protection apparatus.

In some embodiments, the flying capacitor converter comprises a first current sensor that is arranged at the output terminal. The first current sensor may be available in most FCC converters, because this first current sensor may be used for a converter current control, and it may be used, additionally or as an alternative, for a load/source side overcurrent and/or short-circuit detection. The first current sensor may be used, e.g., for a further plausibility check of the faults, both for a cross-check of false-positive faults and of false-positive faults. However, the first current sensor, in most cases, cannot be used reliably to detect converter internal short-circuit faults. A single exception may be a three-wire configuration, e.g. a Y-topology for three phases as shown in FIG. 12.

An aspect relates to a fault detection apparatus configured for performing a method described above and/or below.

An aspect relates to a fault protection apparatus configured for performing a method described above and/or below.

An aspect relates to a flying capacitor DC/AC converter or a flying capacitor DC/DC converter comprising a fault detection apparatus and/or a fault protection apparatus as described above and/or below. The DC/DC converter may, in some embodiments, comprise an additional rectifier, e.g. a diode or an SCR (silicon-controlled rectifier), arranged after the output terminal. Note that there are embodiments, in which a flying capacitor DC/DC converter is realized without this additional rectifier.

In some embodiments, the flying capacitor converter may be a bidirectional converter.

In various embodiments, the capacitor converter further comprises an input capacitor, arranged in parallel to the positive pole and the negative pole.

In various embodiments, the capacitor converter further comprises an output filter, which comprises an LCL filter, arranged after the output terminal.

An aspect relates to a computer program product comprising instructions, which, when is executed by a computer and/or a controller, cause the computer and/or controller to carry out the method as described above and/or below.

An aspect relates to a computer-readable storage medium where a computer program or a computer program product as described above is stored on.

For further clarification, the invention is described by means of embodiments shown in the figures. These embodiments are to be considered as examples only, but not as limiting.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for detecting a plurality of faults in a flying capacitor converter, the flying capacitor converter comprising:

a converter input comprising a positive pole and a negative pole, the positive pole connected to a positive leg of the converter and the negative pole connected to a negative leg of the converter;

an output terminal connected to an output of the positive leg and to an output of the negative leg;

wherein the positive leg comprises a plurality of positive switches, and the negative leg comprises a plurality of negative switches; and wherein an input of each one of the positive switches is connected to a corresponding input of each one of the negative switches via a flying capacitor;

the method comprising the steps of:

measuring, by a second current sensor arranged at the positive pole, a second current;

measuring, by a third current sensor arranged at the negative pole, a third current; and detecting a first fault in the flying capacitor converter when one of the second current and the third current exceeds a first current threshold, and/or when a gradient of the second current or a gradient of the third current exceeds a first gradient threshold.

2. The method of claim 1, wherein the first current threshold is between 200% to 300% of a maximum current of the flying capacitor converter.

3. The method of claim 1, wherein the first gradient threshold is between 1-100 A/µs.

4. The method of claim 1, further comprising detecting a second fault when an absolute value of a sum of the second current plus the third current exceeds a second current threshold, and when a gradient of the absolute value exceeds a second gradient threshold, the second gradient threshold being lower than the first threshold.

5. The method of claim 4, wherein the second current threshold is between 200% and 300% of a normal operation current of the flying capacitor converter, and/or the second current gradient threshold is between 1-100 A/µs.

6. The method of claim 1, further comprising detecting a third fault when a gradient of the second current exceeds a third current threshold, the third current threshold being negative, and a gradient of an absolute value of a sum of the second current plus the third current exceeds a third gradient threshold, the third gradient threshold being lower than the first threshold.

7. The method of claim 5, wherein the third current threshold is between 200% and 300% of a normal operation current of the flying capacitor converter, and/or wherein the third gradient threshold is between 1-100 A/µs.

8. The method of claim 1, wherein each positive switch of the plurality of positive switches is a MOSFET transistor.

9. The method of claim 1, wherein each negative switch of the plurality of negative switches is a MOSFET transistor.

10. The method of claim 1, further comprising:

when detecting the first fault, disconnecting a converter input; and/or switching off at least one positive switch from the plurality of positive switches, the at least one positive switch being disposed adjacent to the positive pole; and/or switching off at least one negative switch from the plurality of negative switches, the at least one negative switch being disposed adjacent to the negative pole.

11. The method of claim 10, further comprising:

when detecting the second fault or the third fault, switching off the at least one positive switch and/or switching off the at least one negative switch.

12. A flying capacitor converter, comprising:

a converter input comprising a positive pole and a negative pole, the positive pole connected to a positive leg of the converter and the negative pole connected to a negative leg of the converter;

an output terminal connected to an output of the positive leg and to an output of the negative leg;

wherein the positive leg comprises a plurality of positive switches, and the negative leg comprises a plurality of negative switches; and wherein an input of each one of the positive switches is connected to a corresponding input of each one of the negative switches via a flying capacitor; and a converter control unit, configured to:

measure, by a second current sensor arranged at the positive pole, a second current;

measure, by a third current sensor arranged at the negative pole, a third current; and detect a first fault in the flying capacitor converter when one of the second current and the third current exceeds a first current threshold, and/or when a gradient of the second current or a gradient of the third current exceeds a first gradient threshold.

13. The flying capacitor converter of claim 12, further comprising an input capacitor arranged in parallel to the positive pole and the negative pole.

14. The flying capacitor converter of claim 12, further comprising an output filter comprising an LCL filter arranged after the output terminal.

* * * * *